(12) United States Patent
Tomita

(10) Patent No.: US 7,126,766 B2
(45) Date of Patent: Oct. 24, 2006

(54) OPTICAL STOP APPARATUS AND EXPOSURE APPARATUS HAVING THE SAME

(75) Inventor: Hiroyuki Tomita, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 591 days.

(21) Appl. No.: 10/442,466

(22) Filed: May 20, 2003

(65) Prior Publication Data

US 2003/0218731 A1   Nov. 27, 2003

(30) Foreign Application Priority Data

May 24, 2002   (JP)   ............... 2002-151637

(51) Int. Cl.
*G02B 9/08*   (2006.01)
*G03B 27/42*   (2006.01)
*G03B 27/72*   (2006.01)
*G03B 27/32*   (2006.01)

(52) U.S. Cl. ............... 359/739; 355/53; 355/71; 355/77

(58) Field of Classification Search ............... 348/363; 355/53, 67, 71, 77; 359/738, 739; 396/505, 396/510
See application file for complete search history.

(56) References Cited

U.S. PATENT DOCUMENTS

| | | | | |
|---|---|---|---|---|
| 2,944,477 A | * | 7/1960 | Tesch | 396/510 |
| 2,949,076 A | * | 8/1960 | Finkl | 396/510 |
| 3,785,265 A | * | 1/1974 | Lardeau | 396/510 |
| 4,199,247 A | * | 4/1980 | Schwarz | 396/510 |
| 4,589,751 A | * | 5/1986 | Metabi | 359/511 |
| 5,592,335 A | * | 1/1997 | Omi et al. | 359/695 |
| 5,884,110 A | * | 3/1999 | Iikawa et al. | 396/509 |
| 5,997,187 A | * | 12/1999 | Hamasaki | 396/449 |
| 6,239,923 B1 | * | 5/2001 | Takezawa | 359/739 |
| 6,867,932 B1 | * | 3/2005 | Noguchi | 359/739 |

FOREIGN PATENT DOCUMENTS

| | | |
|---|---|---|
| JP | 4-107405 | 8/1990 |
| JP | 7-301845 | 11/1995 |
| JP | 2001-291659 | 4/2000 |
| JP | 2001-035772 | 2/2001 |

OTHER PUBLICATIONS

Japanese Office Action dated Sep. 6, 2005 with English translation.

* cited by examiner

*Primary Examiner*—David N. Spector
(74) *Attorney, Agent, or Firm*—Morgan & Finnegan. LLP

(57) ABSTRACT

An optical stop unit includes plural light blocking plates, and a cam mechanism for driving the plural light blocking plates to vary an aperture diameter, the cam mechanism including a cam follower and a cam groove, wherein the cam follower and cam groove have mutually facing surfaces, through which the cam follower and cam groove contact each other, and at least one of which surfaces has a curved section that is substantially perpendicular to a plane formed by the plural light blocking plates.

7 Claims, 9 Drawing Sheets

OPTICAL STOP APPARATUS AND EXPOSURE APPARATUS HAVING THE SAME

This application claims the right of priority under 35 U.S.C. §119 based on Japanese Patent Application No. 2002-151637, filed on May 24, 2002, which is hereby incorporated by reference herein in its entirety as if fully set forth herein.

BACKGROUND OF THE INVENTION

The present invention relates generally to exposure apparatuses, and more particularly to an exposure apparatus that is used to expose an object, such as a single crystal plate for a semiconductor wafer, a glass plate for a liquid crystal display ("LCD"), and the like, an optical stop unit used for such an exposure apparatus, a device fabrication method using the exposed object, and a device fabricated from the exposed object. The present invention is suitable, for example, for an exposure apparatus that exposes a single crystal plate for a semiconductor wafer in a step-and-scan, scan, or step-and-repeat projection manner in a photolithography process.

The "step-and-scan" manner, as used herein, is one mode of exposure method which exposes a pattern on a mask onto a wafer by continuously scanning the wafer relative to the mask or reticle (these terms are used interchangeably in this application) and moving, after a shot of exposure, the wafer stepwise to the next exposure area to be shot. The "scan" manner is another mode of exposure method which uses a projection optical system to project part of a mask pattern onto a wafer, and exposes the entire mask pattern to the wafer by relatively and synchronously scanning the mask and the object relative to the projection optical system. The "step-and-repeat" manner is still another mode of exposure method which moves a wafer stepwise to an exposure area for the next shot every shot of cell projection onto the wafer.

Along with recent demands on smaller and lower profile electronic devices, fine semiconductor devices to be mounted onto these electronic devices have been increasingly demanded. For example, a design rule for a pattern on a mask attempts a line and space (L & S) of 130 nm on a mass production line, which will be predictably increasingly smaller in the future. L & S denotes an image projected to a wafer in exposure with equal line and space widths, and serves as an index of exposure resolution. The exposure has three important factors including resolution, overlay accuracy, and throughput. The resolution is the minimum size for a precise pattern transfer. The overlay accuracy is a precision with which to overlay multiple patterns over an object to be exposed. The throughput is the number of sheets exposed per unit of time.

There are two basic exposure methods including a full-size transfer method and a projection method. The full-size transfer includes a contact method that brings a mask into close contact with an object to be exposed, and a proximity method that slightly spaces them from each other. Although the contact method may provide higher resolution, dusts and silicon fragments enter under a mask in a compressed state, and damage the mask, causing the exposed object to be flawed and defective. The proximity method ameliorates such problems, but still possibly damages the mask if a distance between the mask and the object to be exposed becomes shorter than the maximum size of a dust particle. A projection method has been suggested accordingly which farther spaces the mask from the object to be exposed.

Among projection modes, a scan projection exposure apparatus has been the recent trend for the improved resolution and expanded exposure area, which exposes the entire mask pattern onto the wafer by exposing part of the mask, synchronizing the mask and wafer, and scanning the wafer continuously or intermittently.

A projection exposure apparatus generally includes an illumination optical system that uses light emitted from a light source to illuminate a mask, and a projection optical system located between the mask and the object to be exposed. For a uniform illumination area, the illumination optical system introduces the light from a light source to a light integrator, such as a fly-eye lens, which includes a plurality of rod lenses, and uses a condenser lens to Kohler-illuminate the mask surface with an exit plane of the light integrator as a secondary light source surface.

The following equation provides the resolution R of the projection exposure apparatus where λ is a light-source wavelength and NA is a numerical aperture of the projection optical system:

$$R = k_1 \cdot \frac{\lambda}{NA} \qquad (1)$$

The shorter the wavelength becomes and the higher the NA increases, the better the resolution thus becomes. For improved resolution, an exposure apparatus has recently been put to practical use that has a projection optical system with a higher NA, e.g., NA=0.70 or higher.

A focus range that maintains desired imaging performance is called a depth of focus ("DOF"), which is given by the following equation:

$$DOF = k_2 \cdot \frac{\lambda}{NA^2} \qquad (2)$$

The shorter the wavelength becomes and the higher the NA increases, the smaller the DOF thus becomes. A small DOF would make difficult focusing as well as requiring a flatter plate and a more accurate focusing. Therefore, a large DOF is basically desirable.

An actual process calculates a condition of an optimal NA to improve the resolution while securing the DOF. A projection optical system thus usually includes an optical stop unit for continuously varying NA, selecting and using the NA. For example, as disclosed in Japanese Laid-Open Patent Application 7-301845, a conventional NA-adjusting optical stop unit uses an iris stop unit that includes overlaying plural light blocking plates, and varies a diameter of an aperture by sliding and turning each light blocking plate.

For an enlarged chip size of a semiconductor device, a step-and-repeat exposure apparatus (stepper) is shifted to a step-and-scan exposure apparatus (scanner). The step-and-scan manner uses a slit-shaped exposure field to maximize the performance of a certain boundary in the projection optical system and expand an exposure area.

A large exposure area and an increased NA would enlarge an optical element (such as a lens's effective diameter of about Φ 200~300 mm), and an aperture diameter of an optical stop unit included in an optical system. A large aperture of a stop diameter would enlarge a light blocking plate that makes up an iris stop unit and increase the number of light blocking plates. Since the light blocking plate is adapted to be as thin as possible so that it can shield light having various angles, a larger light blocking plate easily deteriorates its flatness. The deteriorated flatness of the light blocking plate would increase the load to a cam that drives the light blocking plate, causing the cam idle or dead, and uncontrollability of driving. In particular, an optical stop unit is usually housed in a lens barrel in a projection optical system inaccessibly, and any failure and malfunction in the optical stop unit would result in an extensive repair in the exposure apparatus, consequently lowering the economical efficiency of the exposure apparatus, and the throughput of the exposure due to the repair time.

BRIEF SUMMARY OF THE INVENTION

Accordingly, it is an exemplified general object of the present invention to provide a novel and useful optical stop unit, exposure apparatus, device fabrication method, and device, in which the above disadvantages are eliminated.

More specifically, an exemplified object of the present invention is to provide an optical stop unit, exposure apparatus, device fabrication method, and device, which have good economical efficiency and throughput.

An optical stop unit of one aspect of the present invention includes plural light blocking plates, and a cam mechanism for driving the plural light blocking plates to vary an aperture diameter, the cam mechanism including a cam follower and a cam groove that movably accommodates the cam follower, wherein at least one of the cam follower and cam groove has a curved section.

The curved section may have a convex shape facing to the other. The cam follower may have the curved section that is a convex surface contacting the cam groove. The curved surface shape may be a spherical or toroidal surface. The curved surface shape may be a toroidal surface whose bus line is approximately parallel to an outline of a section of the cam groove.

An optical stop unit of another aspect of the present invention includes plural light blocking plates, and a cam mechanism for driving the plural light blocking plates to vary an aperture diameter, the cam mechanism including a cam follower and a cam groove that movably accommodates the cam follower, wherein at least one of the cam follower and cam groove has a cylindrical section that projects towards the other. The cylindrical section may have a height between 0.2 mm and 1.0 mm.

An optical stop unit of another aspect of the present invention includes plural light blocking plates, and a cam mechanism for driving the plural light blocking plates to vary an aperture diameter, the cam mechanism including a cam follower and a cam groove that movably accommodates the cam follower, wherein at least one of the cam follower and cam groove has a cylindrical section that has a height between 0.2 mm and 1.0 mm.

At least one of the cam follower and the cam groove may be notched so that the one has a convex section against the other.

An optical stop unit of still another aspect of the present invention includes plural light blocking plates, and a cam mechanism for driving the plural light blocking plates to vary an aperture diameter, the cam mechanism including a cam follower and a cam groove that movably accommodates the cam follower, wherein at least one of the cam follower and cam groove is notched so that the one has a convex section against the other.

An optical stop unit of still another aspect of the present invention includes plural light blocking plates, and a cam mechanism for driving the plural light blocking plates to vary an aperture diameter, the cam mechanism including a cam follower and a cam groove that movably accommodates the cam follower, wherein at least one of the cam follower and cam groove includes a projection for pivoting the cam follower.

The cam mechanism may further include an annular member arranged approximately parallel to the light blocking plates, and wherein one of the plural light blocking plates and the annular member may have the cam follower, and the other may have the cam groove. The plural light blocking plates may have the cam follower while the annular member may have the cam groove, and a movement of the cam groove may drive the cam follower.

The cam follower may have an anti-friction or plain bearing.

An exposure apparatus of one aspect of the present invention includes an illumination optical system for illuminating a reticle or mask, and a projection optical system that includes the above optical stop unit, and projects a pattern formed on the reticle or mask via the optical stop unit. An exposure apparatus includes an illumination optical system that includes the above optical stop unit and illuminates a reticle or a mask via the optical stop unit, and a projection optical system for projecting a pattern formed on a reticle or a mask.

The device fabrication method as still another aspect of the present invention includes the steps of exposing an object to be exposed by using the above exposure apparatus, and performing a specified process on the exposed object such as a step of developing exposed objects. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
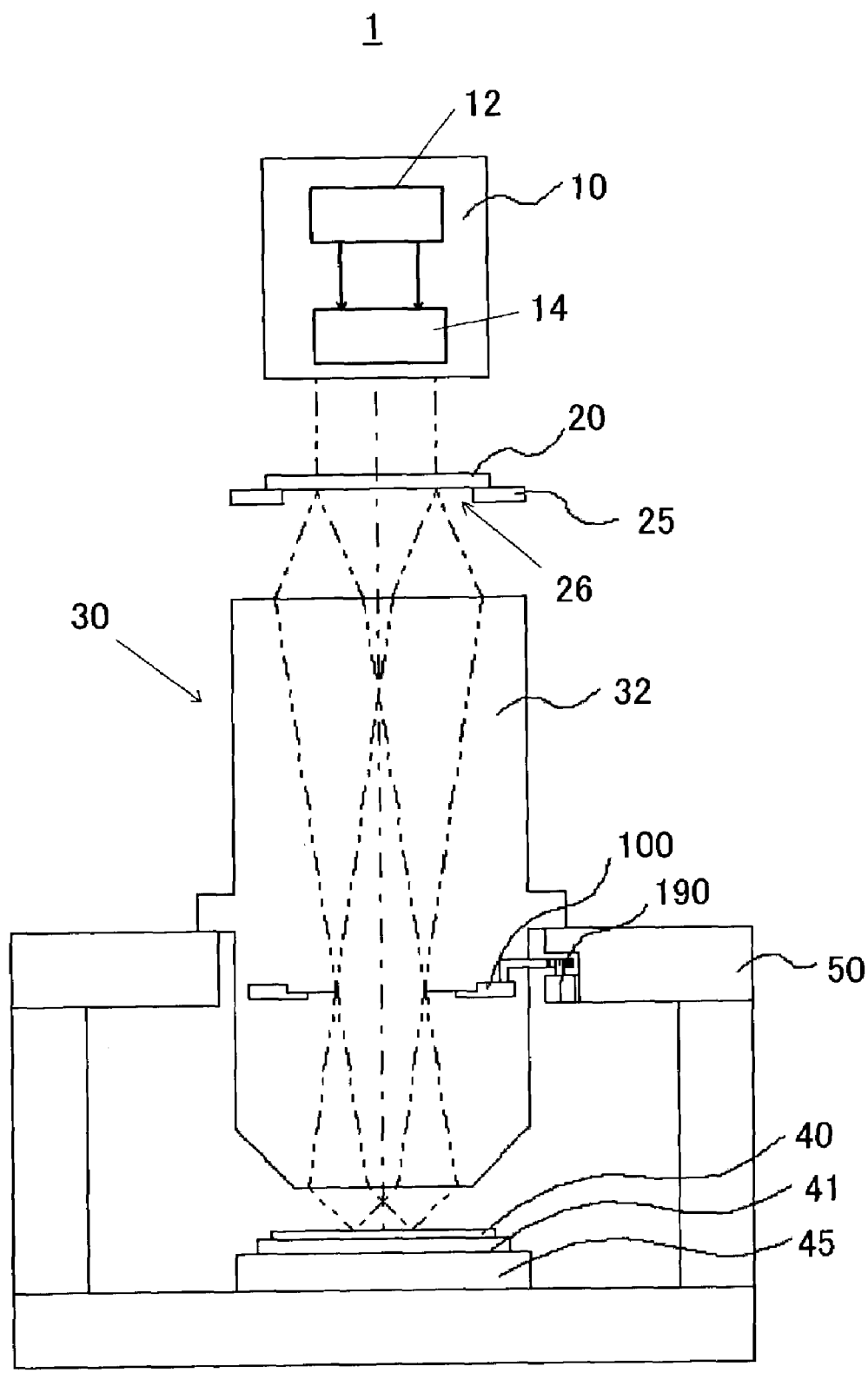
FIG. 1 is a schematic sectional view of an optical stop unit and an exposure apparatus that uses the same according to the present invention.

A description will now be given of an exemplary exposure apparatus 1 of the present invention with reference to FIG. 1. Here, FIG. 1 is a schematic sectional view of the exemplified exposure apparatus 1 of this invention. The exposure apparatus 1 includes, as shown in FIG. 1, an illumination apparatus 10, a reticle 20, a projection optical system 30, a plate 40, and a stage 45. The exposure apparatus 1 is a scan projection exposure apparatus that exposes a circuit pattern formed on the reticle 20 onto the plate 40 in a step-and-repeat or step-and-scan manner.

The illumination apparatus 10 illuminates the reticle 20 that forms a circuit pattern to be transferred, and includes a light source section 12 and an illumination optical system 14.

The light source section 12 uses, for example, laser as a light source. The laser may use ArF excimer laser with a wavelength of approximately 193 nm, KrF excimer laser with a wavelength of approximately 248 nm, $F_2$ excimer laser with a wavelength of approximately 157 nm, etc. A type of laser is not limited to excimer laser. For example, YAG laser may be used, and the number of laser units is not limited. When the light source section 12 uses laser, it is desirable to employ a beam shaping optical system that shapes a parallel beam from a laser source to a desired beam shape, and an incoherent production optical system that turns a coherent laser beam to an incoherent one. A light source applicable to the light source section 12 is not limited to laser, and may use one or more lamps such as a mercury lamp and a xenon lamp.

The illumination optical system 14 is an optical system that illuminates the mask 20, and includes a lens, a mirror, a light integrator, a stop, and the like, for example, in the order of a condenser lens, a fly-eye lens, an aperture stop, a condenser lens, a slit, and an imaging optical system. The illumination optical system 14 may use any light whether it is axial or non-axial. The light integrator may include a fly-eye lens or an integrator formed by stacking two sets of cylindrical lens array plates (or lenticular lenses), and be replaced with an optical rod or a diffractive element. An optical stop unit 100, which will be described later, is applicable as an aperture stop. An aperture stop may be adapted as an annular illumination stop or a quadrupole illumination stop for modified illumination that reduces the proportionality factors $k_1$ and $k_2$ in the equations 1 and 2.

The reticle 20, which forms a circuit pattern (or an image) to be transferred, is made, for example, of quartz and supported and driven by a reticle stage (not shown). Refracted light through the reticle 20 is projected onto the plate 40 through the projection optical system 30. The plate 40 is an object to be exposed, such as a wafer or a liquid crystal plate, onto which resist is applied. The reticle 20 and plate 40 are arranged conjugate with each other. When the exposure apparatus 1 is a scan projection exposure apparatus, it transfers a pattern on the mask 20 onto the plate 40 by scanning the mask 20 and plate 40. When the exposure apparatus 1 is a stepper (or a step-and-repeat exposure apparatus), it exposes while maintaining the mask 20 and plate 40 stationary. The present embodiment fixes the reticle 20 onto a reticle chuck (not shown) in the center of a rectangular reticle stage 25.

The projection optical system 30 projects and exposes, under a specified magnification (e.g., ¼ or ⅕), a pattern on a surface of the reticle 20 illuminated by exposure light from the illumination optical system 14, onto a surface of the object 40, which will be described later. The projection optical system 30 may use an optical system solely composed of a plurality of lens elements, an optical system comprised of a plurality of lens elements and at least one concave mirror (a catadioptric optical system), an optical system including a plurality of lens elements and at least one diffractive optical element such as a kinoform, a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The projection optical system 30 has a lens barrel 32 for holding optical elements (not shown) in the projection optical system 30 and an optical stop unit 105, which will be described later. The lens barrel 32 is provided with an opening 34, as described later.

Figure 2A:
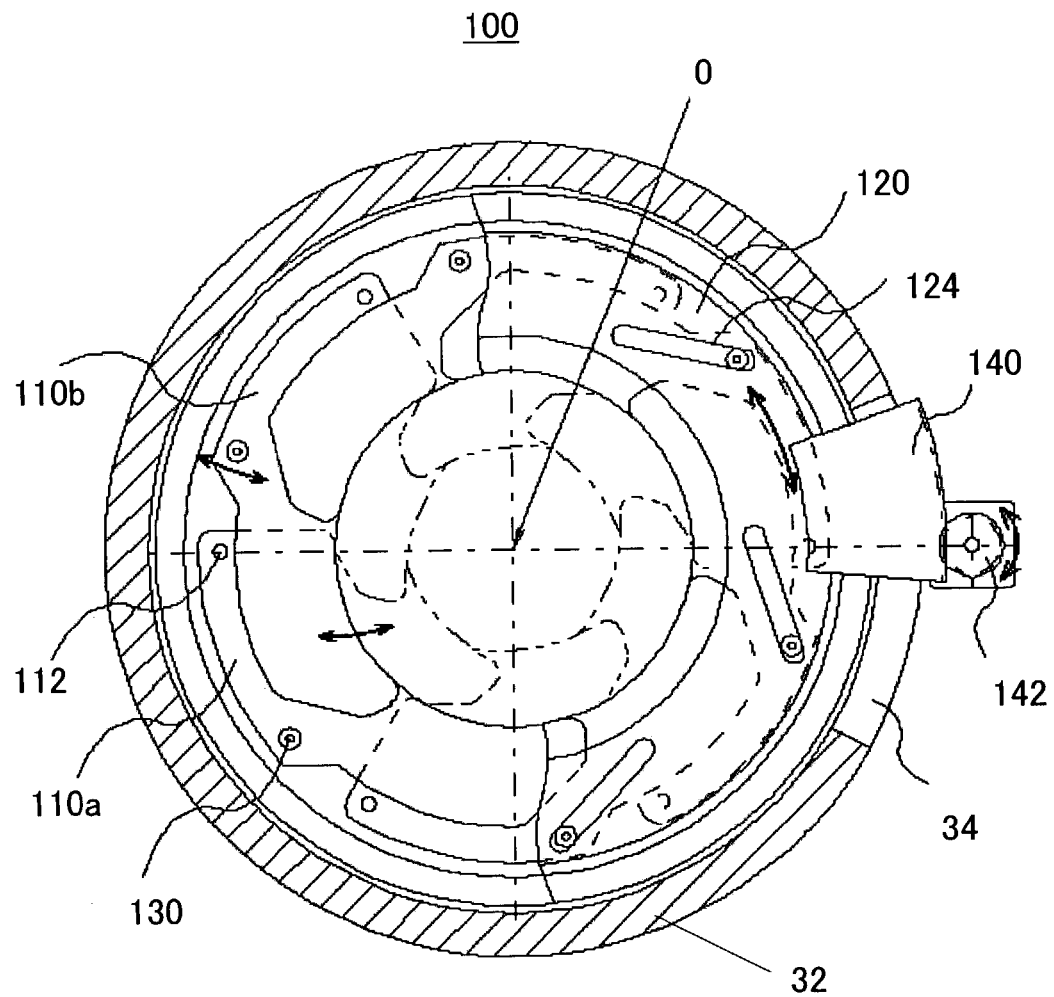
FIG. 2 is a schematic plan and sectional views of the optical stop unit shown in FIG. 1.
Figure 2B:
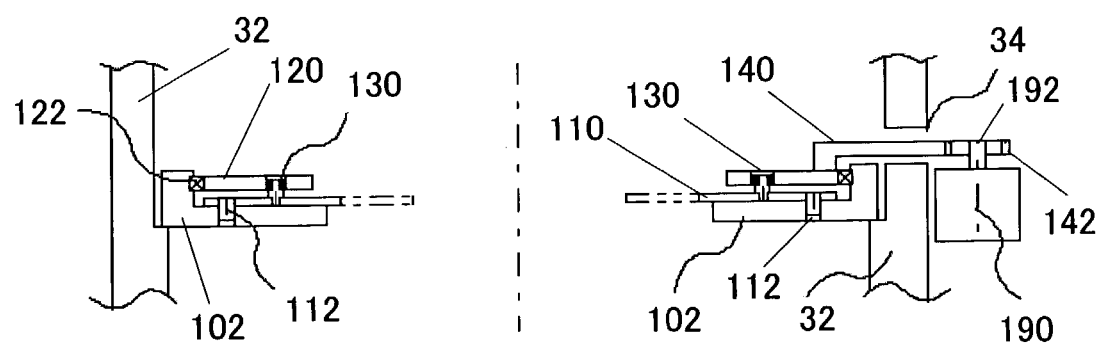

The projection optical system 30 further has the optical stop unit 100 near its pupil position. This optical stop unit 100 may be provided in the optical illumination system 14, preferably near a Fourier conversion surface of the reticle 20 surface. A description will be given below of the optical stop unit 100 with reference to FIGS. 2 to 8. Here, FIG. 2A is a partial perspective plan view of the optical stop unit 100, and FIG. 2(b) a sectional view of the optical stop unit 100. The optical stop unit 100 is supported in the lens barrel 32 via a base plate 102, and includes six light blocking plates 110 (while FIG. 2A differentiates two light blocking plates 110a and 110b), a cam plate 120, a cam follower 130, gears 140 and 142, and a drive unit 190.

The present embodiment exemplarily provides six light blocking plates 110 with the same shape. The light blocking plates 110 are arranged approximately perpendicular to an optical axis O so that their partial areas overlap each other, and may slide to form an opening of a predetermined light intensity. The two overlapping light blocking plates 110 (e.g., the light blocking plates 110a and 110b) have been given a lubricating surface treatment in advance, or may slide each other with low friction through minute projections (not shown) formed on one of their surfaces. The light blocking plates 110 are always forced to close by a forcing means, such as a spring (not shown). Each light blocking plate 110 is rotatable around a fulcrum shaft 112 on the base plate 102, and has the cam follower 130. While this embodiment provides the light blocking plate 110 with the cam follower 130 and the cam plate 120 with a groove 124, but this may be vice versa. The cam follower 130 may be provided to another member that is connected and movable synchronously with the light blocking plates 110. The cam follower 130 serves as a mover that moves the light blocking plate 110 as a result of moving in the groove 124, which will be described below.

The cam plate 120 is supported rotatable around the optical axis O, on the base plate 102 via a bearing 122. The cam plate 120 is an annular plate member arranged almost parallel to the light blocking plates 110. The cam plate 120 forms the cam grooves 124 that define moving directions of the light blocking plates 110, and house the cam followers 130 attached to the light blocking plates 110. While the present embodiment forms and arranges the track-shaped six cam grooves 124 radially, the shape and arrangement are for exemplary purposes. While the present embodiment provides the cam plates 120 with the cam grooves 124, they may be formed in another member that is connected to and movable synchronously with the cam plates 120.

The gear 140 is connected to the cam plate 120, and its side surface has cogs engageable with the gear 142 through the opening 34 in the lens barrel 32. The gear 142 is attached around a motor shaft 192 of the motor 190 as the drive unit, rotatable with the motor shaft 192. As the motor 190 is driven, the motor shaft 192 rotates the gear 142, which in turn moves the gear 140, thus rotating around the optical axis O the cam plates 120 linked to the gear 140. As a result, the cam grooves 124 in the cam plate 120 rotate, and the light blocking plates 110 rotate by a certain amount through the cam followers 130.

Figure 3:
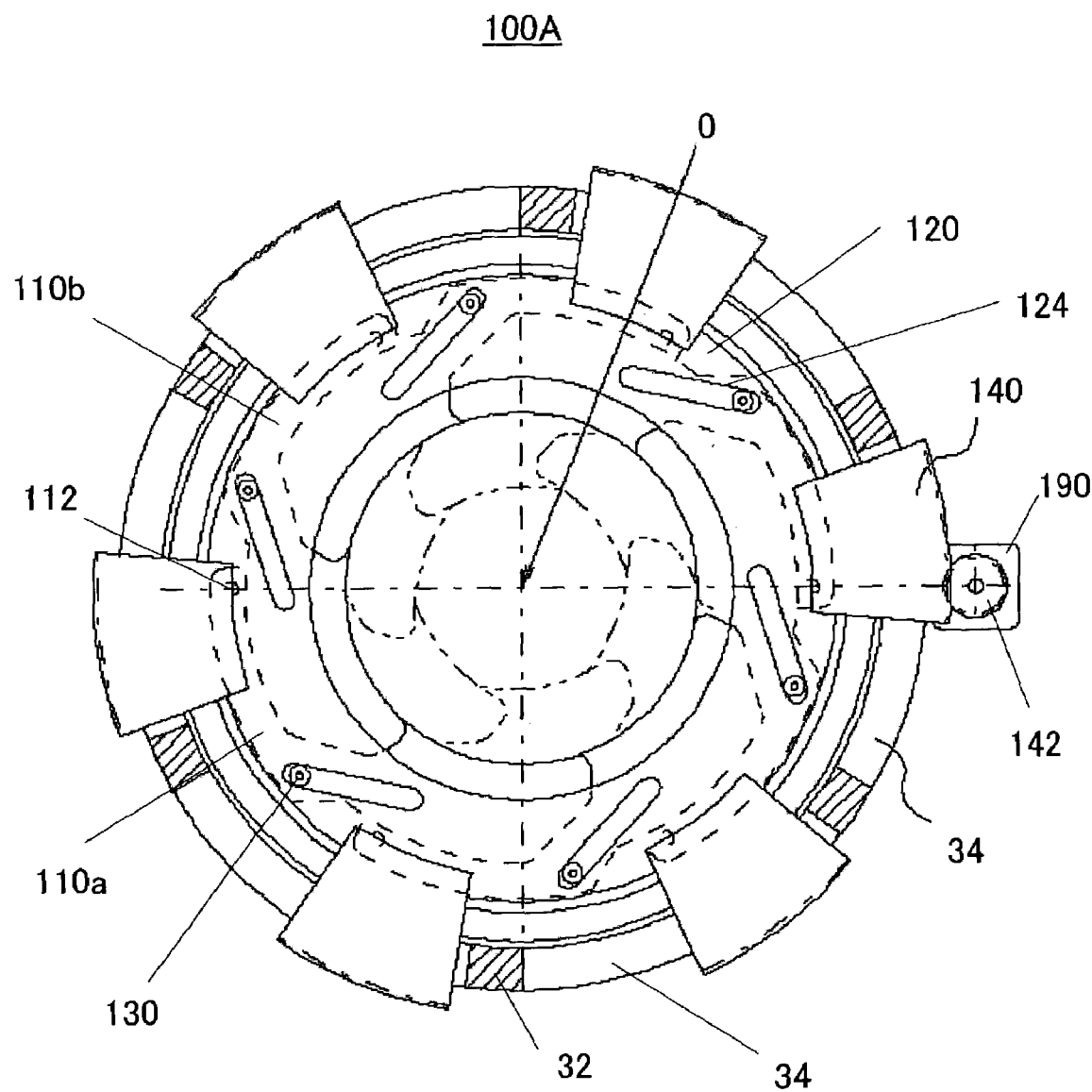
FIG. 3 is a schematic plan view of a variation of the optical stop unit shown in FIG. 2.

The stepper has such a slit-shaped exposure field that it may advantageously select and use an angle around the optical axis, which maximizes the performance of a projection lens (not shown). In order to take advantage of this merit and connect the optical stop unit 100 to the drive unit 190, an optical stop unit 100A may be used that has plural openings 34 and gears 140 in the lens barrel 32, as shown in FIG. 3, around the optical axis O. Here, FIG. 3 is a partial perspective plan view of the optical stop unit 100A as a variation of the optical stop unit 100 shown in FIG. 2. This allows the projection lens (not shown) in the projection optical system 30 to be mounted on the exposure apparatus 1 at any angle around the optical axis O.

While FIG. 3 shows six openings 34, the necessary number of openings 34 may be determined to select an arbitrary angle around the optical axis O without lowering the strength of the lens barrel 32. Instead of plural gears 140, e.g., six in FIG. 3, the gear 140 is adapted removable from the lens barrel 32 from the outside, and only one gear 140 may be attached at a necessary place. As discussed, the lens barrel 32 holds optical elements (not shown) of the projection optical system 30, and must be prevented from deforming, in particular, asymmetrically around the optical axis so as to maintain the performance of the projection optical system 30. It is therefore to prepare the openings 34 at axially symmetrical positions, for example, by taking into consideration deformations of the lens barrel 32 due to processing, a temperature change, and time dependency etc.

Figure 4:
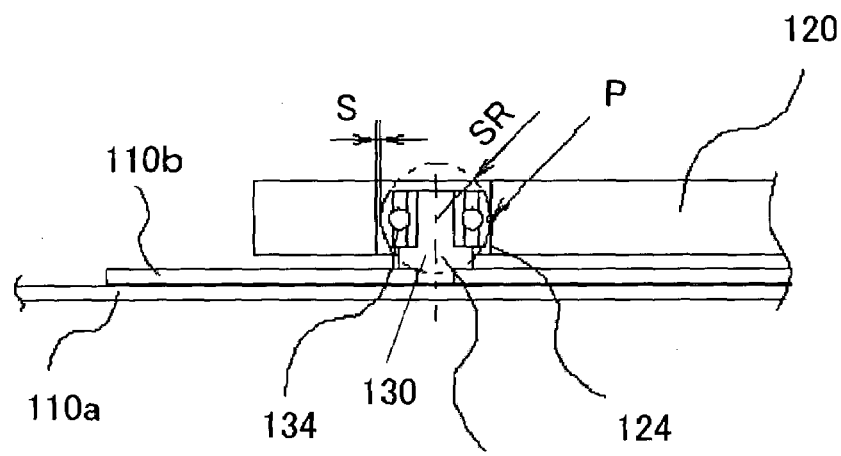
FIG. 4 is a partially enlarged sectional view of the optical stop unit shown in FIG. 2.

FIG. 4 is an enlarged sectional view showing an arrangement among arbitrary adjacent contacting light blocking plates 110a and 110b among six light blocking plates 110, and the cam follower 130 and the cam groove 124. FIG. 4 is a sectional view concerning a section perpendicular to a surface on which the light blocking plate 110 is movable. As illustrated, the cam follower 130 has a bearing shaft 132 that is fixed perpendicular to a surface of the light blocking plate 110, and anti-friction bearings 134 attached to the bearing shaft 132. The bearing shaft 132 is designed to be fixed perpendicular to the light blocking plate 110, but is not perfectly perpendicular to it due to time-dependent deteriorations and attachment errors.

Caulking and/or bonding are used to fix the bearing shaft 132 onto the light blocking plate 110, and to attach anti-friction bearings 134 around the bearing shaft 132. The anti-friction bearing 134 has a spherical outer surface that contacts the cam groove 124. The present embodiment digs the cam grooves 124 exemplarily almost perpendicular to the cam plate 120, as shown in FIG. 4. The present invention is thus also applicable to the groove 124 that has a trapezoid section or other shapes for the purpose of accuracy or convenience of finishing.

As described so far, the cam follower 130 moves (or opens and closes) the light blocking plates 110 by moving along the groove 124 shown in FIG. 2(a) and in its inside. For example, the cam followers 130 force the light blocking plates 110 to move outwardly in order to open the light blocking plates 110. The cam followers 130 incline with time relative to an axis perpendicular to the plane (i.e., paper of FIG. 2A) on which the light blocking plates 110 are movable due to this force or attachment errors of the cam followers 130 onto the blocking plates 110, etc. When the cam follower 130 is not allowed to incline to some extent in a direction perpendicular to a longitudinal direction of the groove 124 shown in FIG. 2A (i.e., a lateral direction in FIG. 4), the cam follower 130 gets stuck or caught in the groove 124, and cannot open and close the light blocking plates 110, resulting in uncontrollability of exposure. The optical stop unit 100 is generally housed in the lens barrel 32, inaccessible from the outside. A failure and malfunction to the optical stop unit 100 would require extensive repair for the exposure apparatus 1. This lowers the economical efficiency of the exposure apparatus 1, and exposure throughput because of the repair.

Figure 5:
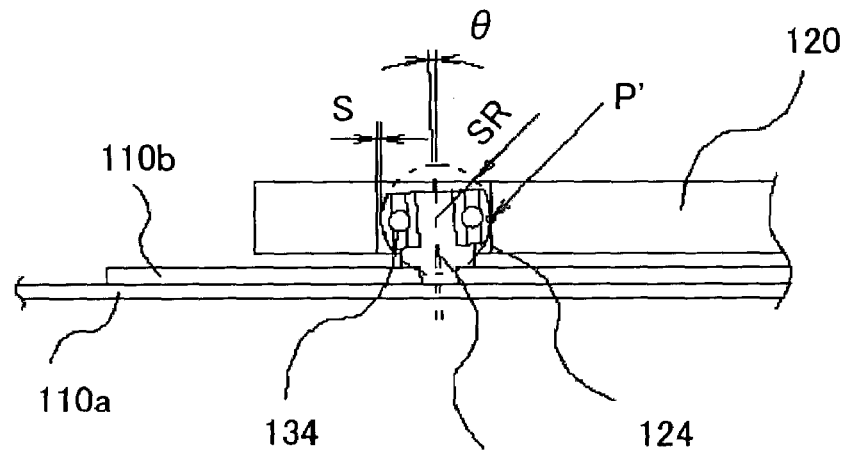
FIG. 5 is an enlarged sectional view of an inclining cam follower of the optical stop unit shown in FIG. 4.

Referring to FIG. 4, a minute clearance "s" between the cam groove 124 and the outer anti-friction bearing 134 allows the anti-friction bearing 134 to rotate smoothly in the cam groove 124. As the cam plate 120 rotates around the optical axis, the contact position between the cam groove 124 and the anti-friction bearing 134 (contact plane of the cam groove 124) changes, but its spherical outer surface may drive the cam follower 130 always using one contact point (i.e., at illustrated point P or its opposite point). For example, even when the bearing shaft 132 inclines, as shown in FIG. 5, by a minute angle θ due to manufacture errors, the bending light blocking plates 110, and the driving load that changes with time, the cam follower 130 may be driven similarly at one contact point (i.e., at point P' or its opposite point). Here, FIG. 5 is an enlarged sectional view of the inclining cam follower 130 shown in FIG. 4. Thus, stacking between the anti-friction bearing 134 and the cam groove 124 or resultant malfunctions would not occur. For more accurate driving of the cam follower 130, a minimum clearance "s" is preferable between the anti-friction bearing 134 and the cam groove 124.

The instant embodiment spherically notches, as shown in FIG. 4, upper and lower parts of the cam follower 130 on a section perpendicular to the plane where the light blocking plates 110 are movable, and separates the cam follower 130 from the linear outline of the cam groove 124. Understandably, a notch shape is not limited to a sphere, but may be a polygon, a circle, an ellipse, a quadratic curve, or any other shape (e.g., the different notched upper and lower parts of the cam follower 130 in FIG. 4), or one of the upper and lower parts may be notched. This allows the cam follower 130 to contact the cam groove 124 at one point or in a narrow area, to retreat its other part from the cam groove 124, and to incline in the cam groove 124 around the contact point or area.

It is understood that the cam follower 130 may alternatively have a cylindrical side surface (i.e., linear shape in FIG. 4) whereas the cam groove 124 may have a curvilinear or U-shaped inner section apart from the cam follower 130. That the cam groove 124 may be worked in place of the cam follower 130 is true to a cam follower 130a, which will be described later, etc. Of course, both of the cam groove and the cam follower may have a curvilinear section.

Various shapes of contact surfaces are conceivable between the cam follower and the cam groove. The cam follower may have a spherical, toroidal, or aspheric surface shape, etc., and this surface has a shape such as a curve, a polygon, etc. that can be approximated by a circle, ellipse, or quadratic curve and a high-order curve on a section including an axis of the cam follower itself. This discussion about the shapes of the cam follower is exactly true to the cam groove. The cam follower and cam groove preferably have mutually facing convex surfaces shape. The cam follower or groove does not have to have the same shaped upper and lower parts. For example, the upper part may have a circular section, and the lower part may have a polygonal section. The upper part may have a circular section whereas the lower part may have an un-notched section. The above notch in either one or both of, or even one of the upper and lower parts of the cam follower and groove would eliminate scuffing of the cam.

The cam follower 130 in the instant embodiment uses the anti-friction bearing 134, but it may use a plain bearing or other bearings. A cam follower with a spherical outer surface may be used in place of the anti-friction bearing where the drive load of the light blocking plates 110 is relatively low, or where the cam's durability to driving is not stressed. Their materials are selected and their surfaces are processed so as to reduce the sliding friction between the cam follower and the cam groove.

Plural stages of optical stop units 100 in the present embodiment may be properly combined and used. While the instant embodiment uses the optical stop unit for an aperture stop or NA stop in the projection optical system 30, the inventive optical stop unit is applicable to an aperture stop or o stop in the illumination optical system 14, as described above.

Figure 6:
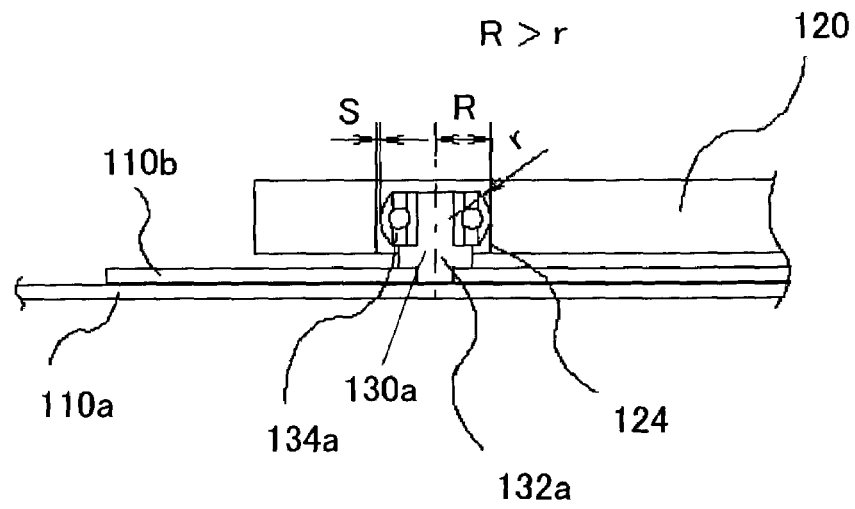
FIG. 6 is a partially enlarged sectional view of another variation of the optical stop unit shown in FIG. 4.

Referring now to FIG. 6, a description will be given of a variation of the optical stop unit 100. The optical stop unit of this embodiment is the same as the optical stop unit 100, but has a different cam structure or shape of the cam follower 130a. FIG. 6 is an enlarged sectional view showing an arrangement among adjacent contact light blocking plates 110a and 110b among the six light blocking plates 110, and the cam follower 130a and the cam groove 124. As illustrated, the cam follower 130a has a bearing shaft 132a fixed perpendicular to the surface of the light blocking plate 110, and anti-friction bearings 134a attached to the bearing shaft 132a. Similar to the bearing shaft 132, the bearing shaft 132 is designed to be fixed perpendicular to the light blocking plate 110, but is not perfectly perpendicular to it due to time-dependent deteriorations and attachment errors. This is similarly true to bearing shafts 132b and 132c, etc. which will be described later. Similarly, fixations of the bearing shaft 132a (and the bearing shaft 132b, etc., which will be described later) and the anti-friction bearings 134b (and the bearing shaft 134b, etc., which will be described later) to the light blocking plates 110 are true to the bearing shaft 132 and the anti-friction bearings 134b, and a detailed description thereof will be omitted.

The outer anti-friction bearing 134a has a toroidal outer surface that is in point contact with one side surface of the cam groove 124 in the cam plate 120 that is approximately perpendicular to the surface of the light blocking plates 110. As the cam plate 120 rotates around the optical axis, a contact position between the cam groove 124 and the anti-friction bearings 134a or the cam groove 124's contact surface) changes, the toroidal outer surface drives the cam always using one contact point.

The outer anti-friction bearing 134a has a toroidal outer surface with R>r in the present embodiment, which may drive the cam follower 130a at one contact point even when the bearing shaft 132a inclines by a minute angle due to manufacture errors, the bending light blocking plate 110, and changes with time. Thus, stacking between the anti-friction bearing 134a and the cam groove 124 or resultant malfunctions would not occur. For more accurate cam driving, a minimum clearance "s" is preferable between the anti-friction bearing 134a and the cam groove 124 by setting (R−r) of the toroidal surface to be smaller. A toric surface may be used instead of the toroidal surface.

The anti-friction bearing 134a of the present embodiment has a toroidal outer surface with R>r, but it may consider manufacture convenience of a toroidal surface shape, the strength of the anti-friction bearings 134a, necessary precision for the cam, etc. in setting R>r. When the bearing shaft 132a inclines by a predetermined angle, the outer surface of the outer anti-friction bearing 134a contacts the cam groove 124 at two points, thus possibly causing stacking and resultant malfunctions. It is thus necessary to secure a specified amount of clearance "s" between the outer surface of the anti-friction bearing 134a and the cam groove 124. The cam follower 130a of this embodiment uses the anti-friction bearing 134a, but a cam follower with a toroidal outer surface may be used in place of the anti-friction bearing where the drive load of the light blocking plates 110 is relatively low, or where the cam's durability to driving is not stressed. Their materials are selected and their surfaces are processed so as to reduce the sliding friction between the cam follower and the cam groove. Thus, similar to the optical stop unit 100, the optical stop unit 100A of the instant embodiment advantageously facilitates manufacture of the cam follower 130a, etc.

Figure 7:
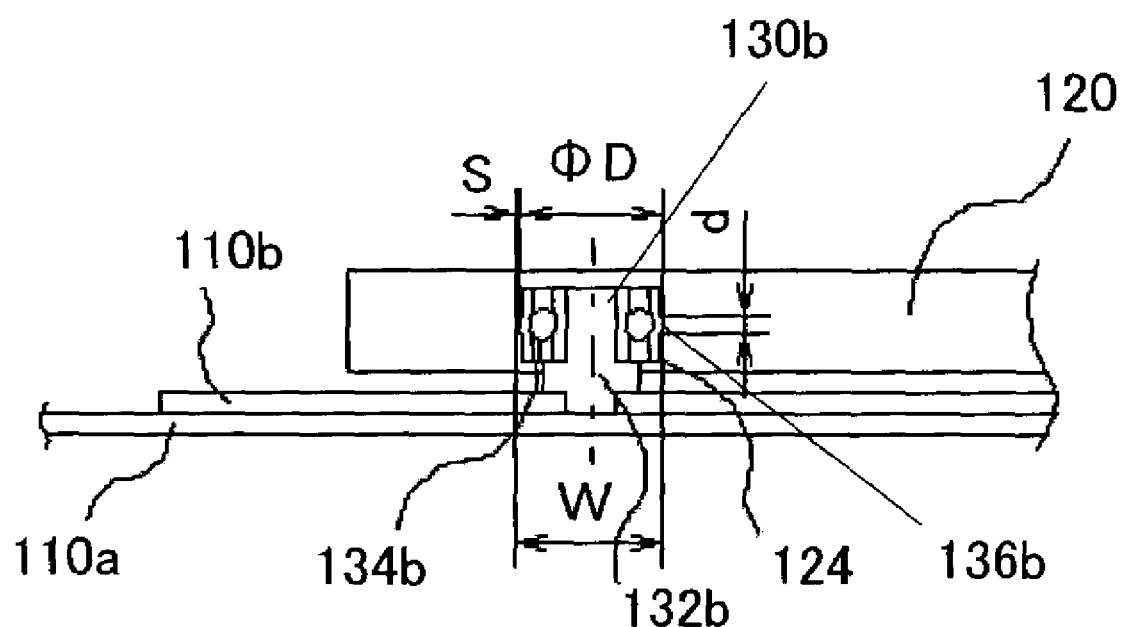
FIG. 7 is a partially enlarged sectional view of still another variation of the optical stop unit shown in FIG. 4.

Referring now to FIG. 7, a description will be given of another variation of the optical stop unit 100. The inventive optical stop unit is similar to the optical stop unit 100, but differs in its cam structure or shape of the cam follower 130. Here, FIG. 7 is an enlarged sectional view showing an arrangement among adjacent contacting light blocking plates 110a and 110b among the six light blocking plates 110, the cam follower 130b and the cam groove 124. As illustrated, the cam follower 130b includes a bearing shaft 132b that is fixed perpendicular to the surface of the light blocking plates 110, anti-friction bearings 134b attached to the bearing shaft 132b, and a disc-shaped projection 136b on a side surface of the anti-friction bearing 134b. The projection 136b is formed as a sectionally stepped cylinder with a limited effective height "d" on the outer surface of the outer anti-friction bearing 134b as illustrated, and in line contact with one side surface of the cam groove 124. As the cam plate 120 rotates around the optical axis O, a contact position changes between the cam groove 124 and the anti-friction bearings 134b or the cam groove 124's contact surface. The projection 136b spaces the cam follower 130b from the cam groove 124-and allows the cam follower 130b to rotate around the projection 136b. The projection 136b allows the cam follower 130b to contact the cam groove 124 at one point or in a narrowed area, and to retreat from the cam groove 124. The follower 130b may incline around the projection 136b in the cam groove 124 against the groove's wall.

Figure 11:
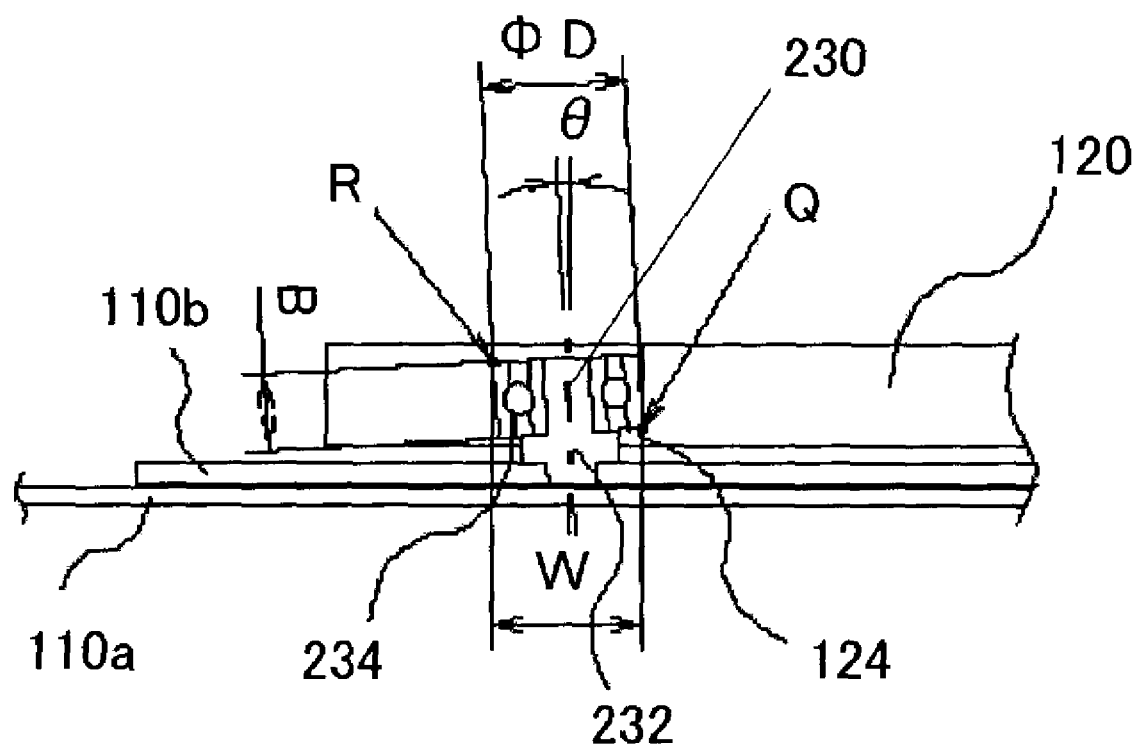
FIG. 11 is an enlarged sectional view of an optical stop unit that has no inclining means of the cam follower in contrast with FIG. 7.

As shown in FIG. 11, when a cam follower 230 uses anti-friction bearings 234 of a cylindrical surface shape with no projection 136b, an inclination of the bearing shaft 232 only by an angle θ would cause the outer surface of the outer anti-friction bearing 234 to contact the cam groove 124 at two points (i.e., at illustrated points Q and R), thus resulting in stacking and resultant malfunctions. For example, stacking occurs when an angle exceeds θ=57° where a diameter ΦD of the outer anti-friction bearing 234 is 6 mm, the width W of the cam groove is 6.1 mm (thus, a clearance between them (W−D) is 0.1 mm), and the height B of the outer surface of the bearing 234 is 3 mm. The cam follower 130b shown in FIG. 7 solves this problem. Alternatively, the cam groove 124c with the projection 125c reduces stacking and resultant malfunctions as shown in FIG. 8.

Figure 8:
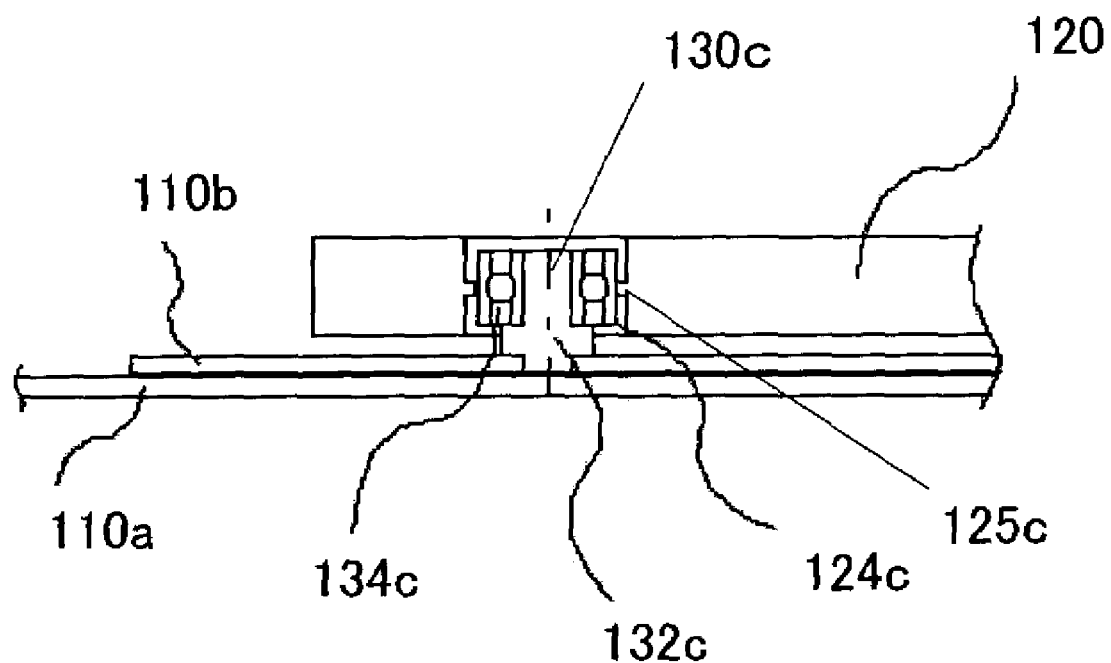
FIG. 8 is a partially enlarged sectional view of still another variation of the optical stop unit shown in FIG. 4.

The structures shown in FIGS. 7 and 8 preferably set d close to 0 to reduce stacking and resultant malfunctions, but may set d by taking into account process accuracy of the anti-friction bearings 134b and the cam groove 124c, an inclination amount of the bearing shaft 132b, the drive precision of the cam plate 120, etc. For example, a clearance may be set to be 0.02 mm or larger to reduce stacking and resultant malfunctions, where the maximum value of the inclination θ is 1°, and the effective height d of the outer surface of the outer anti-friction bearing 134c is 0.5 mm. This may provide a cam mechanism with high precision. The effective height d is made to be 0.2 to 1 mm by taking into account the workablity of the anti-friction bearings 134c, stacking and resultant malfunctions. A sufficient stepped manufacture or clearance is about 0.1 to 0.2 mm for the outer diameter ΦD.

The cam follower 130c of this embodiment uses the anti-friction bearing 134c, but a cam follower with a cylindrical surface with a limited effective height "d" may be used in place of the anti-friction bearing where the drive load of the light blocking plates 110 is relatively low, or where the cam's durability to driving is not stressed. Their materials are selected and their surfaces are processed so as to reduce the sliding friction between the cam follower and the cam groove. A configuration shown in FIG. 8 advantageously facilitates manufacture of the cam follower 130c, etc.

Turning back to FIG. 1, photoresist is applied to the plate 40. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The wafer stage 45 supports the plate 40. The stage 45 may use any structure known in the art, and thus, a detailed description of its structure and operations is omitted. For example, the wafer stage 45 may use a linear motor to move the plate 40 two-dimensionally. The reticle 20 and plate 40 are, for example, scanned synchronously, and the positions of the reticle stage 25 and wafer stage 45 are monitored, for example, by a laser interferometer and the like, so that both are driven at a constant speed ratio. The stage 45 is installed on a stool 50 supported on the floor and the like, for example, via a damper, and the reticle stage 25 and the projection optical system 30 are installed on the plate 50 supported, for example, via a damper to the base-frame placed on the floor.

In exposure, the light emitted from the light source section 12, for example, Koehler-illuminates the reticle 20 through the illumination optical system 14. Light that has passed through the reticle 20 and reflects the mask pattern, is imaged on the plate 40 by the projection optical system 30. Either or both of the illumination optical system 14 and the projection optical system 30 used by the exposure apparatus 1 may include the inventive optical stop unit 100. As a result, the light blocking plates 110 may smoothly open and close. The optical stop unit 100 and the exposure apparatus 1 are economically efficient with few failures, as well as maintaining the desired exposure throughput by eliminating exchanges caused by failures. Accordingly, the exposure apparatus 1 may provide, with high precision and economy, devices (such as semiconductor devices, LCD devices, image pick-up devices (such as CCDs), thin film magnetic heads, and the like).

Figure 9:
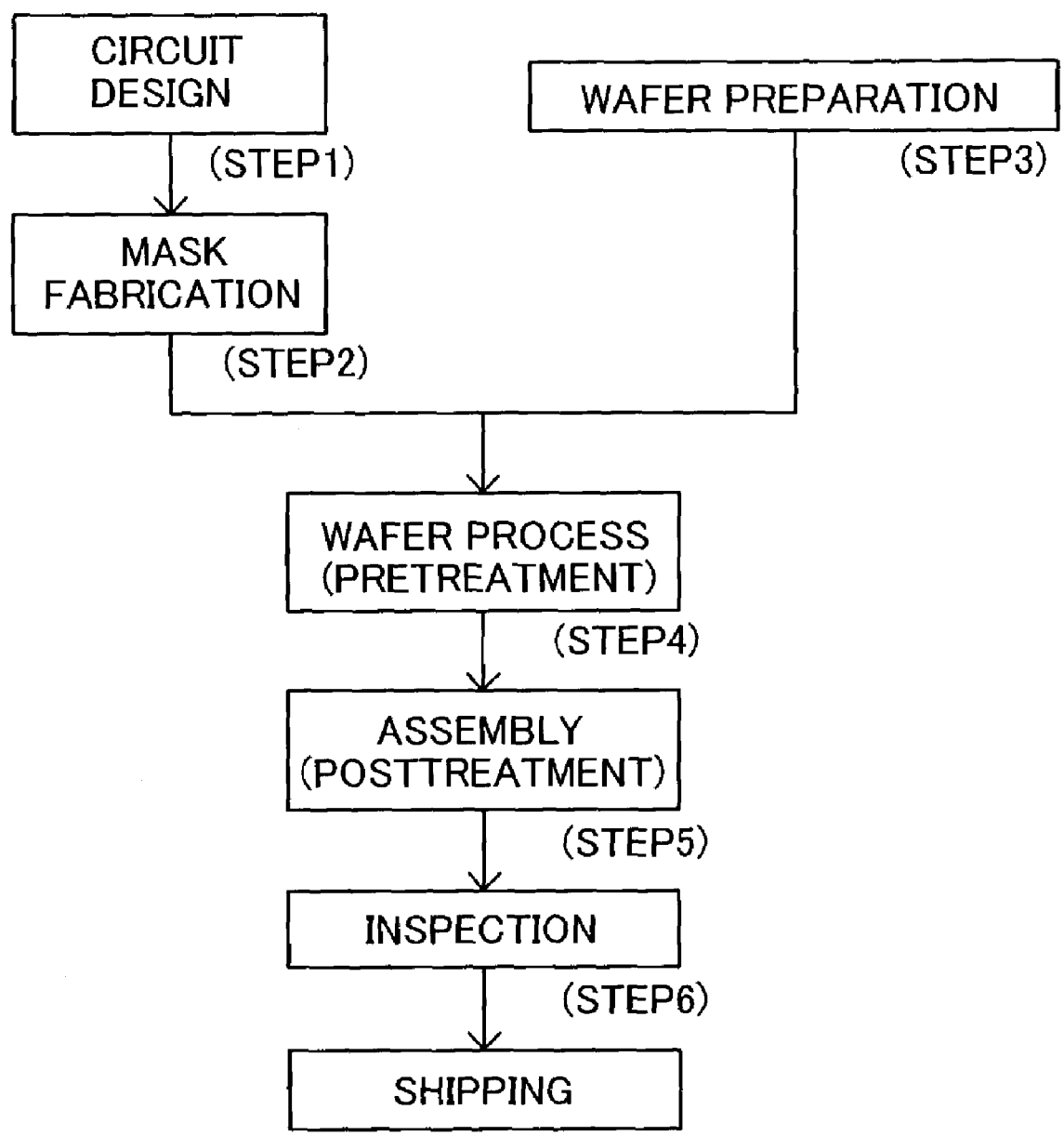
FIG. 9 is a flowchart for explaining a device fabrication method including the exposure steps of the present invention.
Figure 10:
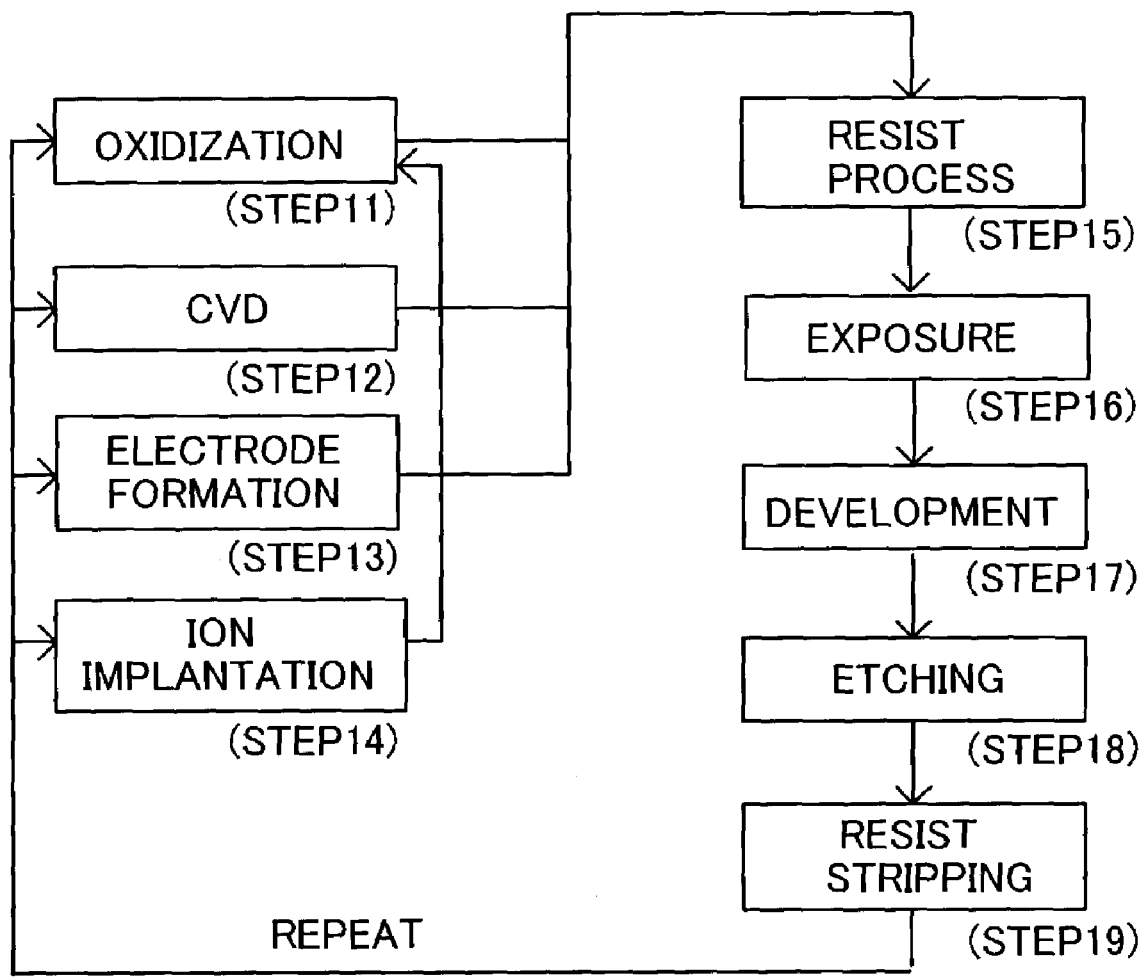
FIG. 10 is a detailed flowchart for Step 4 shown in FIG. 9.

Referring now to FIGS. 9 and 10, a description will be given of an embodiment of a device fabricating method using the above exposure apparatus 1. FIG. 9 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Further, the present invention is not limited to these preferred embodiments, and various variations and modifications may be made without departing from the scope of the present invention.

The inventive optical stop unit and exposure apparatus having the same will maintain smooth operations with a large aperture and wide variable range, and their high durability. Further, the device fabrication method can provide high-quality devices such as semiconductor devices, LCDs, CCDs, thin-film magnetic heads, and the like.

What is claimed is:

1. An optical stop unit comprising: plural light blocking plates; and a cam mechanism for driving said plural light blocking plates to vary an aperture diameter, said cam mechanism including a cam follower and a cam groove that movably accommodates the cam follower, wherein at least one of the cam follower and cam groove has a cylindrical section that projects towards the other, wherein at least one of the cam follower and the cam groove is notched so that the one has a convex section against the other.

2. An optical stop unit comprising: plural light blocking plates; and a cam mechanism for driving said plural light blocking plates to vary an aperture diameter, said cam mechanism including a cam follower and a cam groove that movably accommodates the cam follower, wherein at least one of the cam follower and cam groove has a cylindrical section that projects towards the other, wherein the cam groove and cam follower contact each other at one point.

3. An optical stop unit according to claim 1, wherein the cylindrical section has a height between 0.2 mm and 1.0 mm.

4. An optical stop unit according to claim 1, wherein said cam mechanism further includes an annular member arranged approximately parallel to said light blocking plates, and wherein one of the plural light blocking plates and the annular member has the cam follower, and the other has the cam groove.

5. An optical stop unit according to claim 4, wherein the plural light blocking plates have the cam follower while the annular member the cam groove, and a movement of the cam groove drives the cam follower.

6. An exposure apparatus comprising: an illumination optical system for illuminating a reticle or mask using light from a light source; and a projection optical system for projecting a pattern formed on the reticle or mask onto an object to be exposed, wherein said illumination optical system includes an optical stop unit and illuminates the reticle or mask via the optical stop unit and/or said projection optical system includes the optical stop unit and projects the pattern onto the object via the optical stop unit, and wherein the optical stop unit includes plural light blocking plates, and a cam mechanism for driving said plural light blocking plates to vary an aperture diameter, said cam mechanism including a cam follower and a cam groove that movably accommodates the cam follower, wherein at least one of the cam follower and cam groove has a cylindrical section that projects towards the other, wherein at least one of the cam follower and the cam groove is notched so that the one has a convex section against the other.

7. A device fabrication method comprising the steps of:

providing an exposure apparatus that includes an illumination optical system for illuminating a reticle or mask using light from a light source; and a projection optical system for projecting a pattern formed on the reticle or mask onto an object to be exposed, the illumination optical system includes an optical stop unit and illuminates the reticle or mask via the optical stop unit and/or said projection optical system includes the optical stop unit and projects the pattern onto the object via the optical stop unit, the optical stop unit includes plural light blocking plates, and a cam mechanism for driving said plural light blocking plates to vary an aperture diameter, the cam mechanism including a cam follower and a cam groove that movably accommodates the cam follower, at least one of the cam follower and cam groove has a cylindrical section that projects towards the other, at least one of the cam follower and the cam groove is notched so that the one has a convex section against the other;

exposing an object to be exposed using said exposure apparatus; and processing the exposed object.

* * * * *